United States Patent
Bocher et al.

(10) Patent No.: US 9,964,611 B2
(45) Date of Patent: May 8, 2018

(54) NMR SPECTROMETER WITH ERGONOMICALLY ADVANTAGEOUS SAMPLE CHANGER

(71) Applicant: Bruker BioSpin GmbH, Rheinstetten (DE)

(72) Inventors: Thomas Bocher, Karlsruhe (DE); Diether Maier, Rheinstetten (DE); Volker Reiss, Jockgrim (DE)

(73) Assignee: Bruker BioSpin GmbH, Rheinstetten (DE)

( * ) Notice: Subject to any disclaimer, the term of this patent is extended or adjusted under 35 U.S.C. 154(b) by 887 days.

(21) Appl. No.: 14/458,282

(22) Filed: Aug. 13, 2014

(65) Prior Publication Data

US 2015/0061678 A1    Mar. 5, 2015

(30) Foreign Application Priority Data

Aug. 29, 2013  (DE) .................. 10 2013 217 227

(51) Int. Cl.
 *G01R 33/30* (2006.01)
 *G01R 33/383* (2006.01)
 (Continued)

(52) U.S. Cl.
 CPC ......... *G01R 33/307* (2013.01); *G01R 33/383* (2013.01); *G01R 33/46* (2013.01); *G01R 33/58* (2013.01)

(58) Field of Classification Search
 CPC ...... G01R 33/46; G01R 33/58; G01R 33/307; G01R 33/383
 See application file for complete search history.

(56) References Cited

U.S. PATENT DOCUMENTS 4,352,066 A * 9/1982 Kendrick ............. G01R 33/307
                                                                324/311
4,581,583 A   4/1986 Van Vliet
                      (Continued)

FOREIGN PATENT DOCUMENTS

| JP | H05 87899 | 4/1993 |
|----|-----------|--------|
| JP | 2005062066 | 3/2005 |
| JP | 2006 234539 | 9/2006 |

OTHER PUBLICATIONS

Anonymous: "Almanac 2011—Analytical Tables and Product Overview, Pa. 88-90", Online Internet Article, 2011, Pa. 1, 87-90.

*Primary Examiner* — Dixomara Vargas
(74) *Attorney, Agent, or Firm* — Paul Vincent

(57) ABSTRACT

An NMR spectrometer (1') has a sample changer (4') with at least one cylindrical sample holder (7', 7") for receiving an elongated NMR sample at a loading position (5) and for transferring the NMR sample into the measurement volume at a transfer position (6). The sample holder is open in an upward direction and the cylinder axis of the cylindrical sample holder is inclined at the loading position by an angle of inclination a of between 30 and 60 degrees with respect to the vertical and it extends vertically at the transfer position. A positioning device is provided, which transfers the NMR sample at or after the transfer position into the measuring position in the measurement volume with a vertically aligned sample axis of the NMR sample. The spectrometer enables a more ergonomically favorable feed of the sample.

15 Claims, 12 Drawing Sheets

(51) Int. Cl.
*G01R 33/46* (2006.01)
*G01R 33/58* (2006.01)

(56) References Cited

U.S. PATENT DOCUMENTS

| | | | |
|---|---|---|---|
| 4,859,948 A | 8/1989 | Kuster | |
| 5,260,657 A * | 11/1993 | Lewis | G01R 33/307 |
| | | | 324/307 |
| 5,534,780 A | 7/1996 | Lilly | |
| 5,754,048 A * | 5/1998 | Bielecki | G01R 33/307 |
| | | | 324/321 |
| 5,760,586 A * | 6/1998 | Foerster | G01R 33/307 |
| | | | 324/318 |
| 6,686,741 B2 * | 2/2004 | Hasegawa | G01R 33/3635 |
| | | | 324/318 |
| 7,081,753 B2 * | 7/2006 | Mullen | G01R 33/3635 |
| | | | 324/318 |
| 7,482,810 B2 * | 1/2009 | Yamauchi | G01R 33/307 |
| | | | 324/318 |
| 8,217,655 B2 * | 7/2012 | De Vries | G01R 33/307 |
| | | | 324/321 |
| 8,436,616 B2 * | 5/2013 | Endo | G01R 33/307 |
| | | | 324/318 |
| 8,547,099 B2 * | 10/2013 | Takegoshi | G01R 33/307 |
| | | | 324/309 |
| 8,692,548 B2 * | 4/2014 | Hoyt | G01R 33/305 |
| | | | 324/307 |
| 9,063,060 B2 * | 6/2015 | Inukai | G01N 24/08 |
| 9,279,869 B2 * | 3/2016 | Shinagawa | G01R 33/30 |
| 9,335,389 B2 * | 5/2016 | Takegoshi | G01R 33/30 |
| 9,372,247 B2 * | 6/2016 | Takegoshi | G01R 33/31 |
| 9,581,663 B2 * | 2/2017 | Endo | G01R 33/307 |
| 9,778,332 B2 * | 10/2017 | Ozaku | G01R 33/305 |
| 2005/0280415 A1 | 12/2005 | Hofmann | |
| 2007/0202017 A1 | 8/2007 | Himmelsbach | |

* cited by examiner

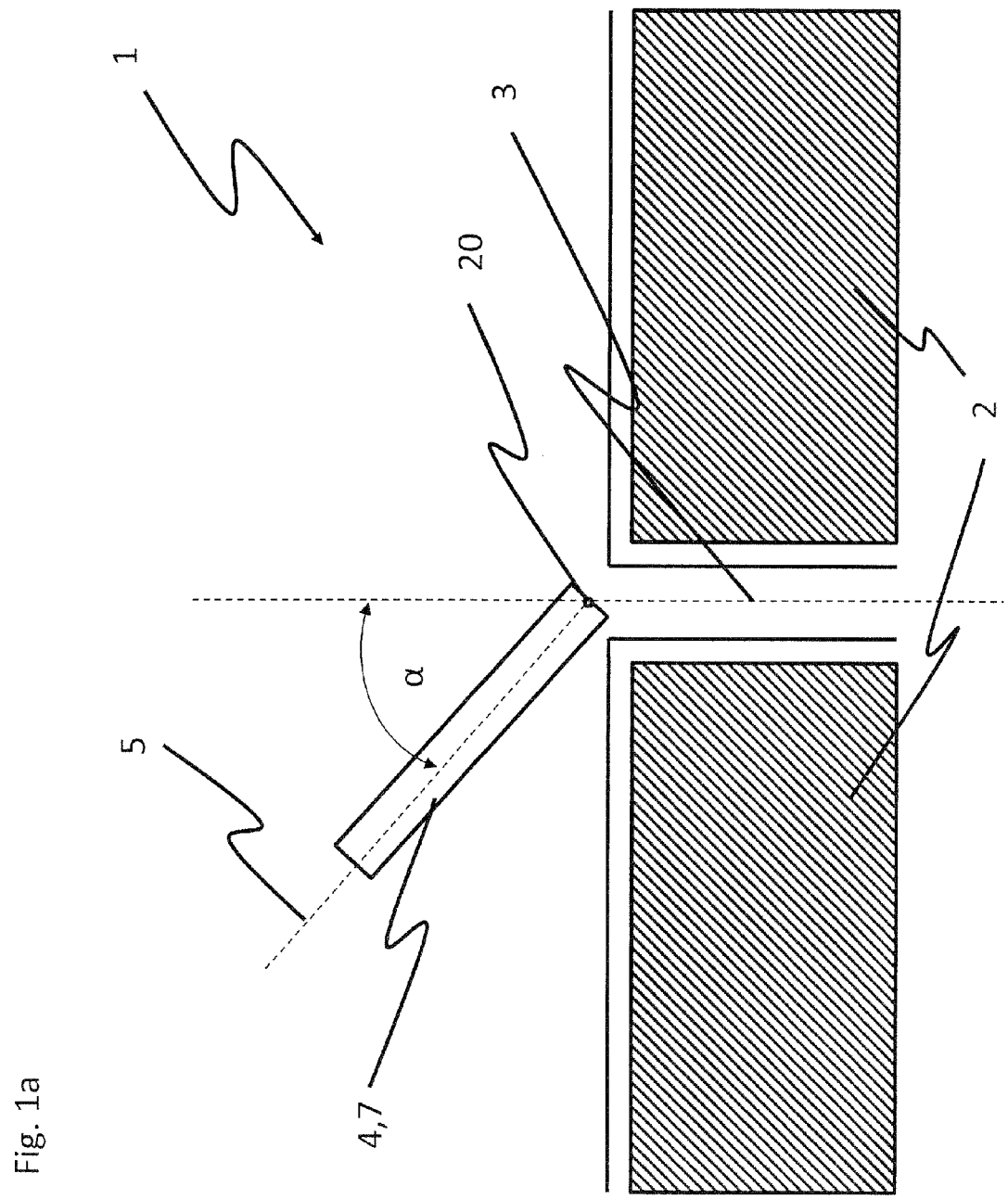

NMR SPECTROMETER WITH ERGONOMICALLY ADVANTAGEOUS SAMPLE CHANGER

This application claims Paris convention priority from DE 10 2013 217 227.3 filed Aug. 29, 2013 the entire disclosure of which is hereby incorporated by reference.

BACKGROUND OF THE INVENTION

The invention concerns an NMR (=nuclear magnetic resonance) spectrometer comprising a magnet configuration with a substantially vertically aligned elongated upper opening for receiving an elongated NMR sample extending along a sample axis, in particular, in a sample vial, with a measurement volume, in which, while an NMR measurement is being performed, the elongated NMR sample is positioned in a measuring position with a vertically aligned sample axis, and with a sample changer with at least one cylindrical sample holder for receiving the NMR sample at a loading position and for transferring the NMR sample into the measurement volume at a transfer position Such an NMR spectrometer with a sample changing facility to be loaded vertically from above is described, for example, in DE 37 29 819 or in U.S. Pat. No. 5,534,780.

Spectroscopic techniques are commonly used in instrumental analysis to examine the chemical composition of samples. To measure a sample in NMR spectroscopy, for example, a sample is placed in a very strong static magnetic field and radio frequency (=RF) pulses are irradiated into the sample. The response of the sample to the RF pulses is measured. The static magnetic field is generated by the superconducting magnet coils; in modern high-resolution NMR spectrometers, the magnet coils are cooled with liquid helium in a cryostat. Such NMR spectrometers are more than one meter in height and are not suitable for use as table-top devices.

Various sample changers for NMR spectrometers are known from prior art. For example, U.S. Pat. No. 5,534,780 cited above has a sample changer with a vertical configuration. Here, NMR samples are released by a switching mechanism at a transfer position and mechanically conveyed into the magnet.

DE 10 2006 006 705 B4 describes details of a pneumatically operated sample changing apparatus for elongated NMR glass sample vials. Here, the glass sample vials are enclosed by a sample holder for immobilizing and transporting a glass sample vial, wherein the sample holder directly surrounds the NMR sample and moves with it into the measurement volume.

To be able to use large cost-intensive NMR spectrometers as economically as possible, the time it takes to change between different samples must be kept as short as possible. To achieve a high throughput of samples on NMR spectrometers, automatic sample changers are often used. On these conventional NMR spectrometers, samples are changed automatically by transferring a sample from a sample storage with a multiplicity of samples to a measuring location in the room temperature bore of the cryostat and back again.

However, in the case of smaller and more compact NMR spectrometers, NMR samples are usually loaded by hand, wherein, in particular, with NMR table-top devices, accessibility when transferring an NMR sample to the NMR spectrometer has so far been achieved in an ergonomically unfavorable manner. Due to the height and usual dimensions of the device, until now, samples had to be inserted vertically from above into a measurement volume in the region of the magnet. To do this, the person operating the device usually has to stretch his or her arm relatively far, which is strenuous and uncomfortable when samples are loaded and changed frequently.

The object of this invention is therefore to provide an ergonomically more favorable sample feed on an NMR spectrometer using suitable means.

SUMMARY OF THE INVENTION

This object is achieved with an NMR spectrometer with the characteristics defined in the introduction, which is characterized in that, the sample holder for accepting the elongated NMR sample is open in an upward direction and, in order to achieve better access and ergonomically more favorable sample feed at the loading position, the cylinder axis of the cylindrical sample holder of the sample changer is inclined with respect to the vertical by an angle of inclination a of between 30 and 60 degrees while it extends vertically at the transfer position, and a positioning device is provided, which transfers the NMR sample at the transfer position or after having passed through the latter into the measuring position in the measurement volume with a vertically extended sample axis of the NMR sample.

In this way, substantial ergonomic improvement and easier handling by the operating personnel is achieved.

By limiting the angle range to a minimum of approximately 30 degrees, a liquid NMR sample is prevented from flowing out of a sample vial filled to a relatively high level when it is transported into the sample holder. Also, the column of liquid is prevented from moving too far out of equilibrium by a horizontal meniscus in the center of the vial, which, when the NMR sample was moved into the vertical measuring position, would result in unwanted compensatory movement of the liquid sample and therefore in an uneven measuring signal.

In an advantageous embodiment, the angle of inclination a of the cylinder axis of the sample holder at the loading position is between 40 and 50 degrees with respect to the vertical, wherein—based on the results of statistical surveys—especially favorable ergonomic conditions for operating the NMR spectrometer can be provided for the majority of operating personnel within a sufficiently "broad" body height range and for an assumed average table height of 70 cm. The angle range of 40 to 50 degrees corresponds to the angle range within which the human hand can easily hold an elongated NMR sample in order to place it in an NMR spectrometer.

In a preferred embodiment, the sample holder has a funnel-shaped opening for easier insertion of an NMR sample. This makes it easier to center the NMR sample when inserting it into the sample holder. Moreover, the user receives haptic feedback about the positioning of the sample in the sample holder.

The NMR sample, which is inserted at the loading position and held in place by a locking device, is conveyed to the transfer position via the sample changer. Embodiments of the inventive NMR spectrometer are preferred that are characterized in that the sample holder has an electrically controlled locking device, which releases the NMR sample at the transfer position. The change movement is preferably performed automatically after the sample has been inserted and a sample cover has been closed by a motor. In this way, the measurement sequence is simplified because the user of the device merely has to insert the sample, after which measurement automatically starts.

Embodiments of the invention are also especially advantageous in which the NMR spectrometer comprises a mechanism for pneumatically lowering and raising an NMR sample at the transfer position. In this way, careful transfer of the NMR sample into the measurement volume is guaranteed. Moreover, the air stream from the measurement volume to the sample holder in the measurement volume can be controlled without further aids that would restrict the installation space there.

For better measured value averaging, embodiments are advantageous in which the NMR spectrometer comprises a device for pneumatically spinning an NMR sample in the region of the measurement volume. For this, the receiving device in the measurement volume contains flow nozzles with a tangential component. In particular, by spinning, asymmetries of the sample and the measuring apparatus are averaged out. Typical spin frequencies are in the range of multiples of 10 hertz.

In further preferred embodiments of the inventive NMR spectrometer, the magnet configuration may comprise a horseshoe magnet, a ring magnet, or a segment magnet of any shape having a vertical opening. With the vertical opening, it is ensured that the sample can be placed by the sample changer into the magnet as the result of gravity. Moreover, a pneumatically operated spin movement of an elongated NMR sample can only be advantageously implemented in a vertical orientation of an NMR sample in the measurement volume. A deviation of even just a few degrees will result in irregular results in the NMR measurement.

Preferably, the angle of inclination a of the cylinder axis of the sample holder at the loading position is adjustable. In this way, it can be adapted to individual conditions such as body height and/or table height. For example, a standard NMR spectrometer is provided with an angle of inclination a of 50 degrees but can be adjusted for a user with a large body height to an angle of, for example, 40 degrees.

To avoid adverse effects of the environment and also for safety reasons, in advantageous embodiments of the invention the sample changer can be equipped with a cover, which can be opened while the NMR spectrometer is being loaded with one or more NMR samples. Because sample vials for liquid NMR samples are often made of glass and are pneumatically rotated in the sample volume, it is important to cover the openings of the sample changer during the measurement operation. In this way, any splinters resulting from glass breakage would remain in the device and the user would not be injured.

The cover can also comprise an electronic or mechanical switching contact, which triggers semi-automatic changing of the NMR sample.

A variant of this embodiment is especially preferred in which the sample changer comprises a motor, which, after inserting an NMR sample at the loading position and closing the cover, moves the sample changer in such a way that the NMR sample is brought into the transfer position. In this way, operation of the NMR spectrometer by the user is further simplified, because he or she does not have to operate any additional button on the NMR spectrometer or in the NMR software in order to trigger an NMR measurement.

In one class of advantageous embodiments, the sample changer of the inventive NMR spectrometer comprises a rocker that can be rotated around a horizontal axis of rotation. Such a changing apparatus is relatively simple and can be implemented at low cost.

An alternative class of embodiments is characterized in that the sample changer is designed as a cone carousel, which can be rotated around an axis of rotation, which is inclined with respect to the vertical in order to perform the change from the loading position to the transfer position.

In especially favorable variants of this embodiment, the angle of the axis of rotation with respect to the vertical is between 15 and 30 degrees, preferably between 20 and 25 degrees.

For a high throughput and low-cost operation of the inventive NMR spectrometer, it is highly advantageous if the sample changer comprises further sample holders for storing NMR samples, into which further NMR samples can be placed for storage. In this way, after the sample changer has been loaded, a series of measurements can be performed. With respect to adapting the angle of inclination a, it must be noted that when an NMR sample is placed in the sample holder at the loading position, the sample changer is not necessarily in the correct position for the sample changer at the transfer position. For this, a further rotation of the sample changer by an additional angle must be performed. The NMR spectrometer and the sample vial for an NMR sample are generally implemented in such a way that an elongated NMR sample fits completely inside the measurement volume without protruding into the sample changer. This avoids destruction of the NMR sample by a change movement of the sample changer.

An especially preferred variant of these embodiments is characterized in that a calibration sample for calibration and self-monitoring of the NMR spectrometer is placed in a further sample holder. In this way, in alternation with each sample measurement, calibration can be performed to check and, if necessary, correct the settings of the NMR spectrometer. For example, in this way, the currents of shim coils, which surround the probe head of the spectrometer, can be corrected so that the homogeneity of the magnetic field in the measurement volume meets the requirements. Additionally, effects of the environment on the NMR spectrometer, such as, for example, temperature and air humidity, can be monitored and compensated for, if necessary.

Further advantages result from the description and the drawing. Moreover, according to the invention, the features stated above and further below can be used singly or together in any combination. The embodiments shown and described are not intended to be an exhaustive list, rather are examples to explain the invention. In particular, an inventive sample changer is also advantageous for NMR spectrometers with cryostats, because here the vertically aligned elongated opening is difficult to access and, in particular, difficult to see, even with a ladder or a platform. In this case, too, a loading position inclined by at least 30 degrees of a sample changer would considerably enhance ease of operation.

The invention is shown in the drawing and is explained in more detail using the examples of the embodiments. The figures show:

BRIEF DESCRIPTION OF THE DRAWING

FIG. 1a A highly schematic representation of a first embodiment of an inventively modified NMR spectrometer with a simple sample changing facility, which only has a single cylindrical sample holder, wherein the sample holder is positioned with its cylinder axis in the inclined loading position by an angle of inclination a with respect to the vertical;

FIG. 4b A plan view onto the embodiment according to FIG. 4a;

DESCRIPTION OF THE PREFERRED EMBODIMENT

Figure 1B:
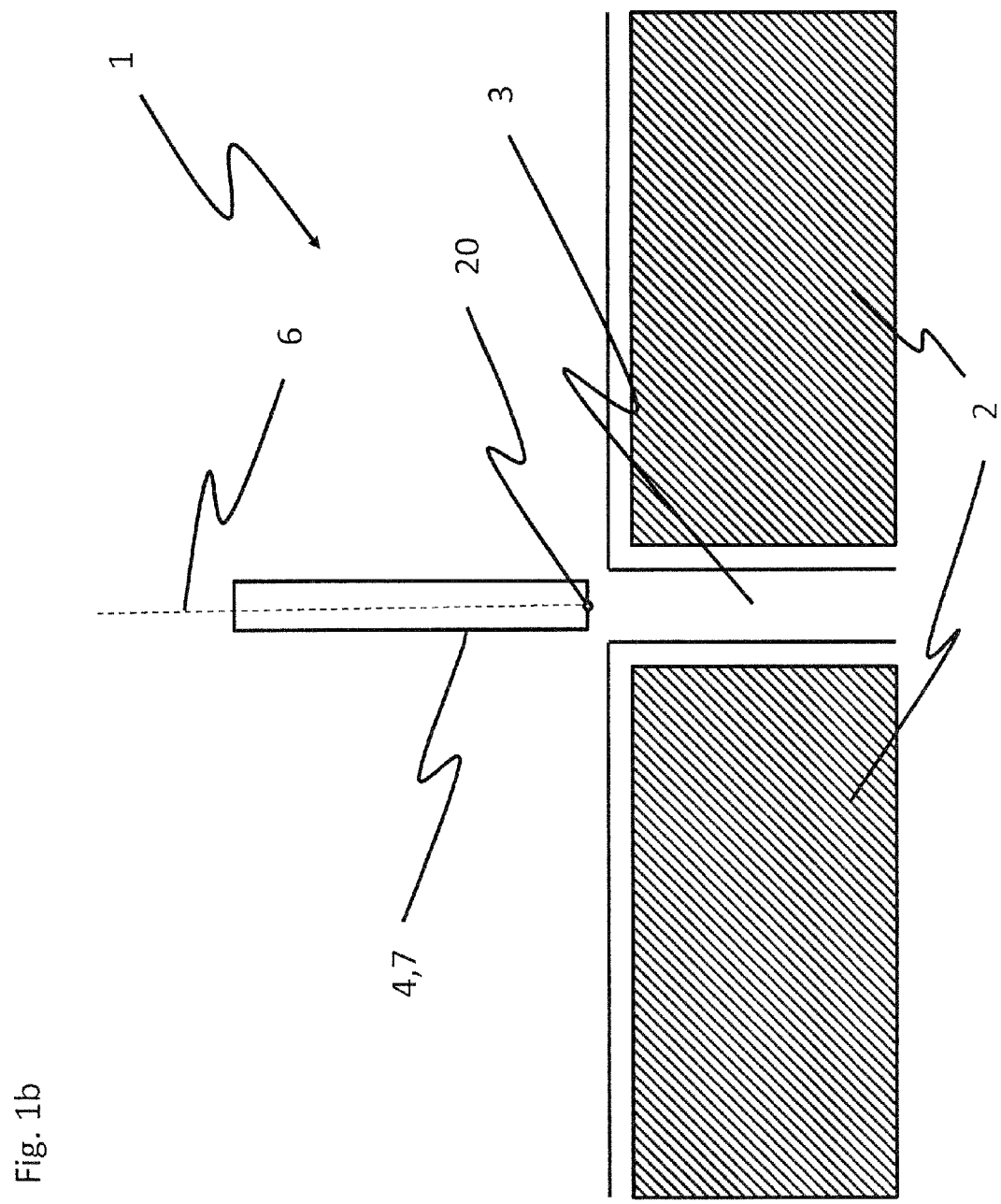
FIG. 1b As in FIG. 1a, but with the cylinder axis of the sample holder in the vertical transfer position.

Each of the embodiments shown in the figures of the drawing of the inventive NMR spectrometer 1; 1'; 1"; 1''' has a magnet configuration 2, which can comprise a horseshoe magnet, a segmented magnet, or a ring magnet, with a substantially vertically aligned elongated opening for receiving an elongated NMR sample extending along a sample axis, which is usually located in a sample vial. While an NMR measurement is being performed, the elongated NMR sample is positioned in a measuring position with a vertically aligned sample axis in a measurement volume 3 in the field generated by the magnet configuration 2.

The NMR spectrometer 1; 1'; 1"; 1''' has a sample changer 4; 4'; 4"; 4''' with at least one cylindrical sample holder 7; 7',7"; 7a,7b,7c,7d,7e,7f for receiving the NMR sample at a loading position 5 and for transferring the NMR sample into the measuring volume 3 at a transfer position 6.

According to the invention, the NMR spectrometer 1; 1'; 1"; 1' is characterized in that the cylinder axis of the cylindrical sample holder 7; 7',7"; 7a,7b,7c,7d,7e,7f of the sample changer 4; 4'; 4"; 4' at the loading position 5 is inclined by an angle of inclination a of between 30 and 60 degrees, preferably between 40 and 50 degrees, with respect to the vertical, while at the transfer position 6 it extends vertically, and that a positioning device is provided, which transfers the NMR sample at the transfer position 6 or after having passed through the latter into the measuring position in the measurement volume 3 with a vertically aligned sample axis of the NMR sample.

The angle of inclination a of the cylinder axis of the sample holder 7; 7',7"; 7a,7b,7c,7d,7e,7f at the loading position 5 is preferably designed to be adjustable.

The sample holder 7; 7',7"; 7a,7b,7c,7d,7e,7f can also have a funnel-shaped opening to more easily receive the NMR sample, which, however, is not shown in any greater detail in the figures of the drawing.

Also not shown in the drawing are advantageous embodiments of the inventive NMR spectrometer, which can have an electrically controlled locking device, which releases the NMR sample at the transfer position 6, and/or a device for pneumatically lowering or raising the NMR sample at the transfer position 6, and/or a device for pneumatically spinning the NMR sample in the region of the measurement volume 3.

FIG. 1a is shows—in a very schematic representation—a first embodiment of an inventive NMR spectrometer 1, which has a very simple sample changing facility comprising only a single cylindrical sample holder 7. The latter can be tilted through a horizontal rotating axis 20 from the inclined loading position 5 shown in FIG. 1a inclined by the angle of inclination a with respect to the vertical into the vertical transfer position 6 shown in FIG. 1b.

Figure 2A:
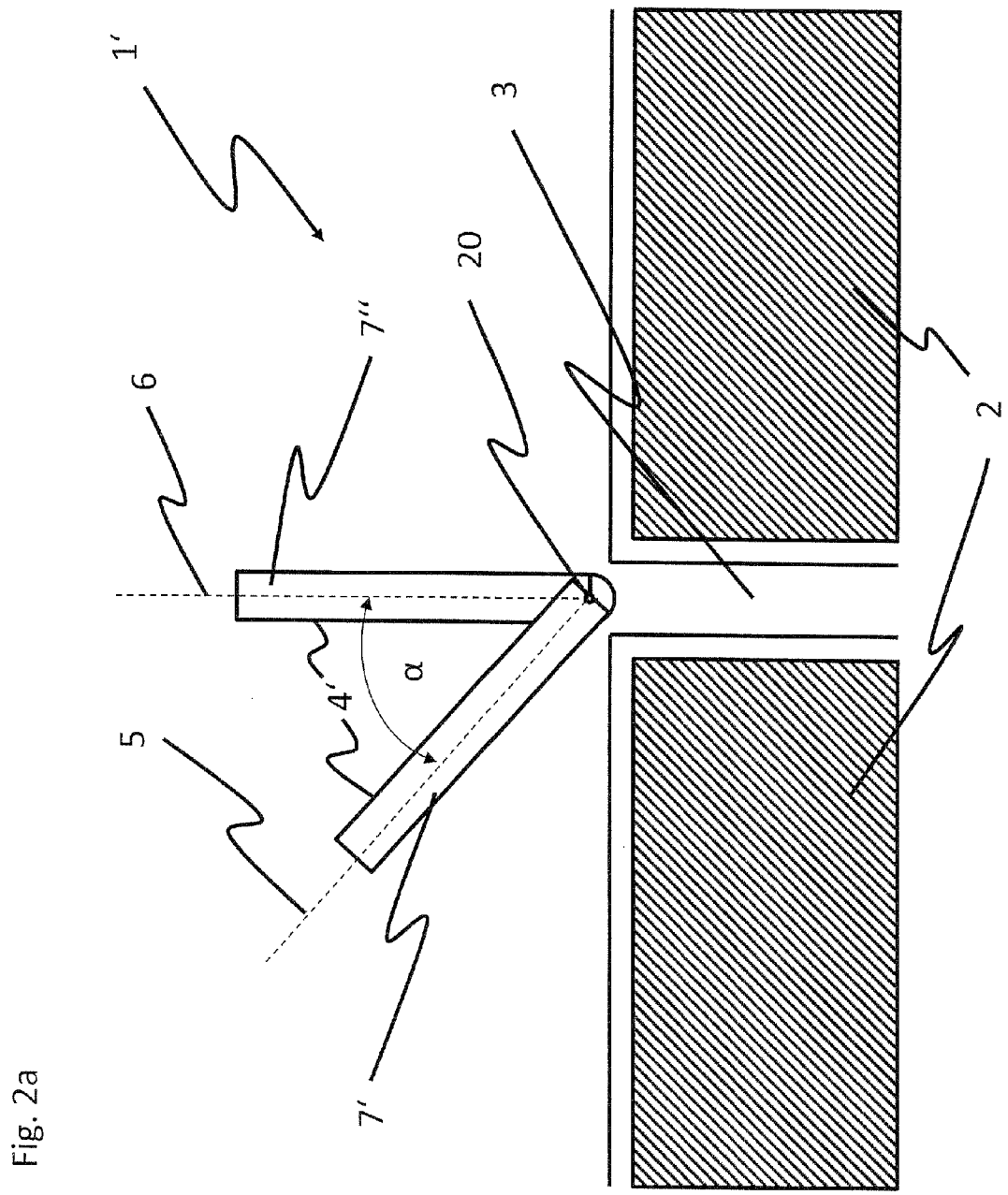
FIG. 2a A schematic side view of a second embodiment with a sample changer in the form of a rocker, which can be rotated around a horizontal axis of rotation, with two sample holders, of which the first is in the inclined loading position, the second is in the vertical transfer position.

FIG. 2a shows a second embodiment of the inventive NMR spectrometer 1' with a sample changer 4' in the form of a rocker, which can be rotated around the horizontal axis of rotation 20, which has two sample holders 7', 7", of which, in FIG. 2a, the first is in the inclined loading position 5, while the second is in the vertical transfer position 6.

Figure 2B:
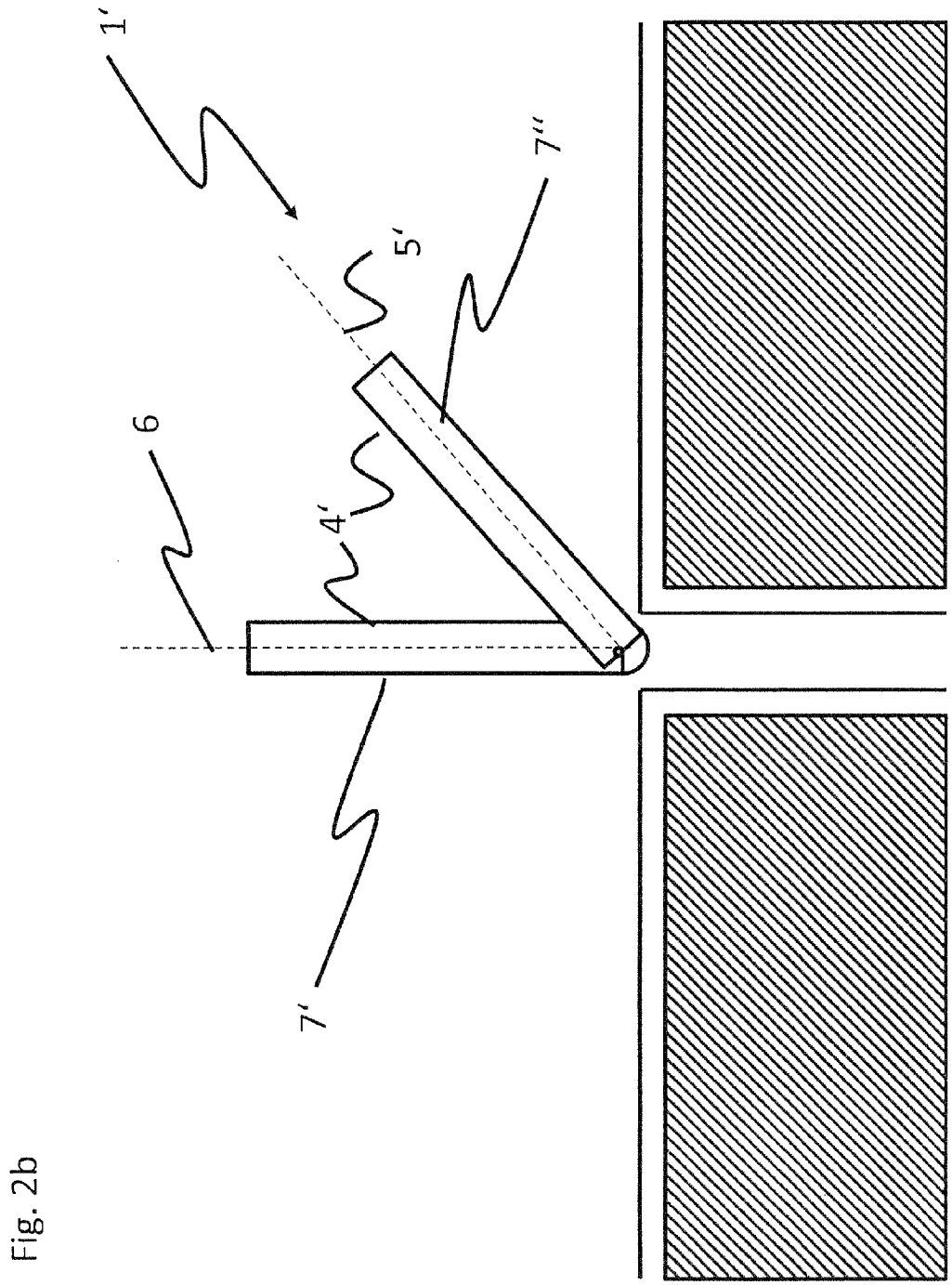
FIG. 2b The embodiment of FIG. 2a, but with the first sample holder in the vertical transfer position and the second sample holder in an inclined storage position inclined by an angle of inclination a with respect to the vertical.

By contrast, FIG. 2b shows the embodiment of FIG. 2a in a position, in which the first sample holder 7' is in the vertical transfer position 6 and the second sample holder 7" is inclined in an inclined storage position 5' by an angle of inclination a with respect to the vertical.

Figure 2C:
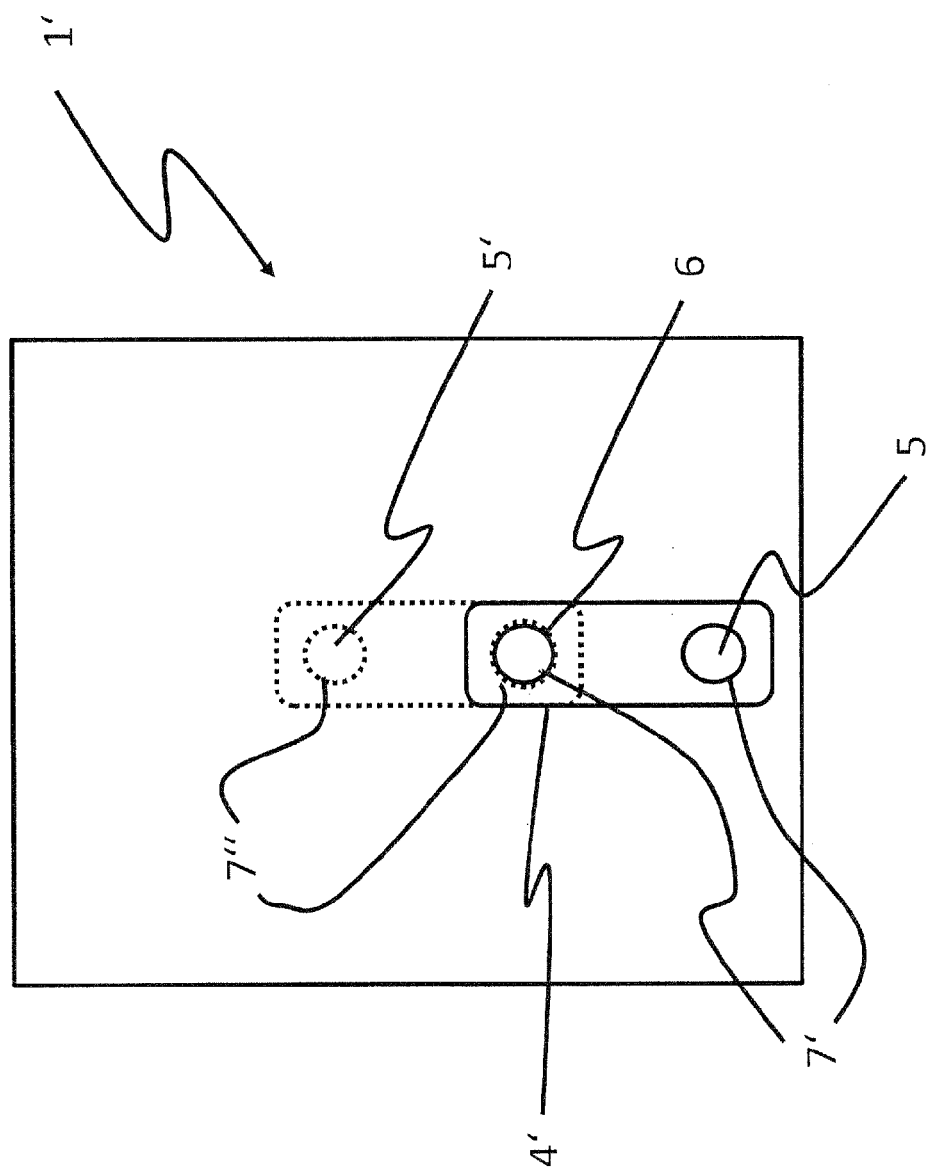
FIG. 2c A schematic plan view onto the second embodiment with the situation illustrated in FIG. 2a represented by a solid line and the situation illustrated in FIG. 2b represented by a dotted line.
Figure 2D:
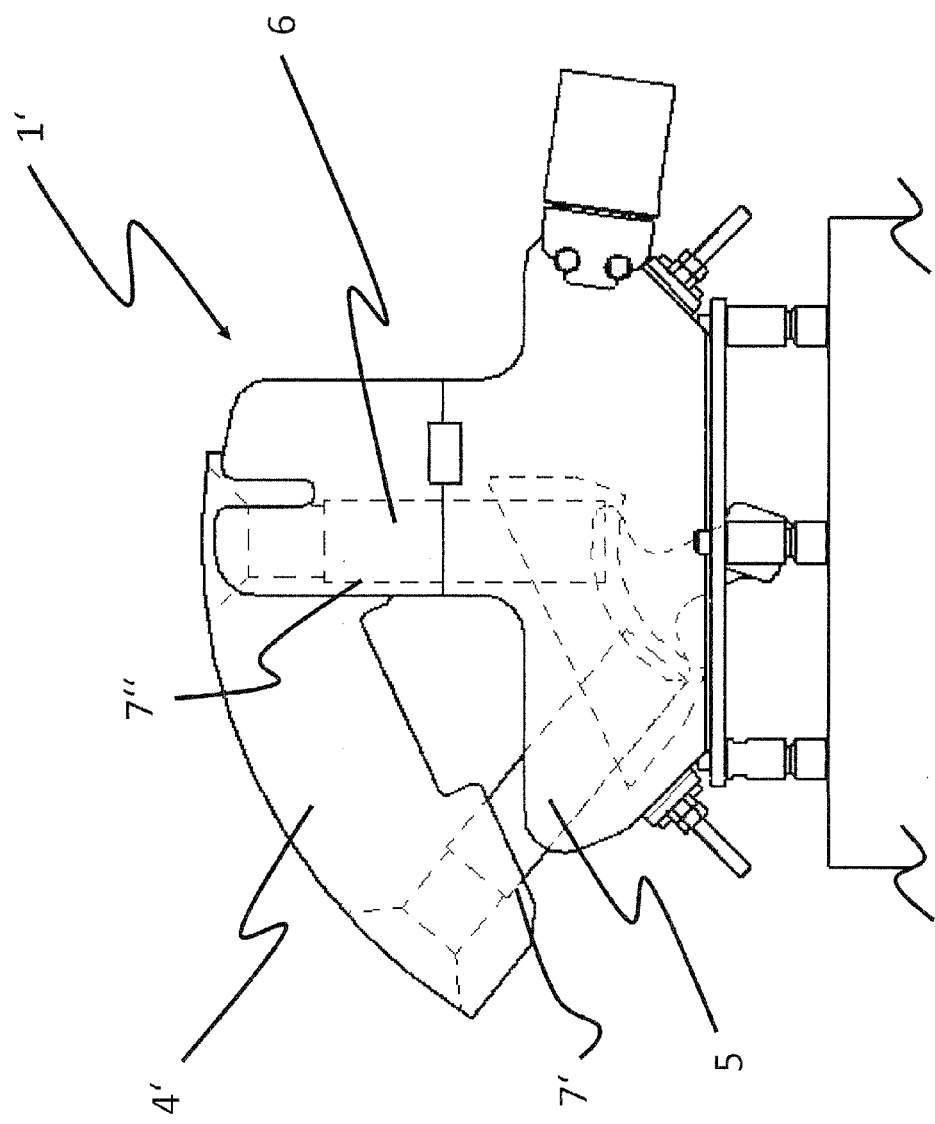
FIG. 2d A schematic, partially transparent three-dimensional side view of a sample changer according to FIGS. 2a to 2c.

FIG. 2c clearly illustrates both of the positions of the two sample holders 7', 7" shown in FIGS. 2a and 2b in a schematic plan view onto the second embodiment. The solid line illustrates the situation according to FIG. 2a and the dotted line illustrates the situation according to FIG. 2b.

In contrast to the highly schematic representations of the second embodiment of the inventive NMR spectrometer 1' in FIGS. 2a to 2c, FIG. 2d shows a partially transparent three-dimensional side view of the sample changer 4', which stands on a magnet configuration, which here is only vaguely suggested.

Figure 3A:
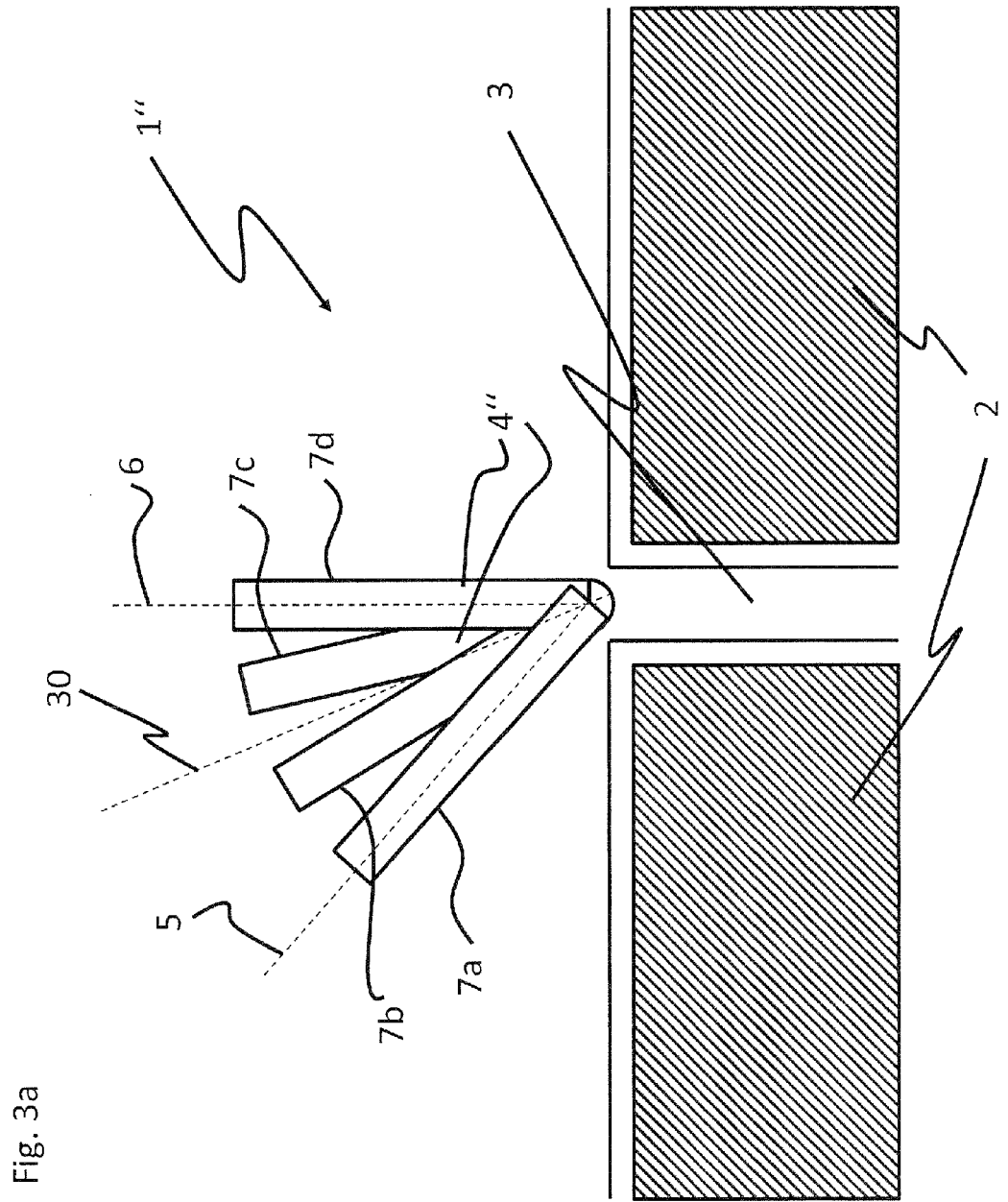
FIG. 3a A schematic side view of a third embodiment, in which the sample changer is designed as a cone carousel, which can be rotated around an axis of rotation, which is inclined with respect to the vertical, with a total of six sample holders, of which the first is in the inclined loading position, the fourth is in the vertical transfer position, and the remaining sample holders are each in inclined storage positions.

FIG. 3a shows a schematic side view of a third embodiment of the inventive NMR spectrometer 1", in which the sample changer 4" is designed as a cone carousel, which can be rotated around an axis of rotation 30 inclined with respect to the vertical, and whose angle with respect to the vertical as a rule is between 15 and 30 degrees, preferably between 20 and 25 degrees.

The cone carousel is equipped with a total of six sample holders 7a, 7b, 7c, 7d, 7e, 7f, of which the first (7a) is in the inclined loading position 5, the fourth (7d) is in the vertical transfer position 6 and the remainder (7b, 7c, 7e, 7f) are each in inclined storage positions. A calibration sample for calibrating and self-monitoring of the NMR spectrometer 1" can be inserted in one of the sample holders 7a, 7b, 7c, 7d, 7e, 7f.

Figure 3B:
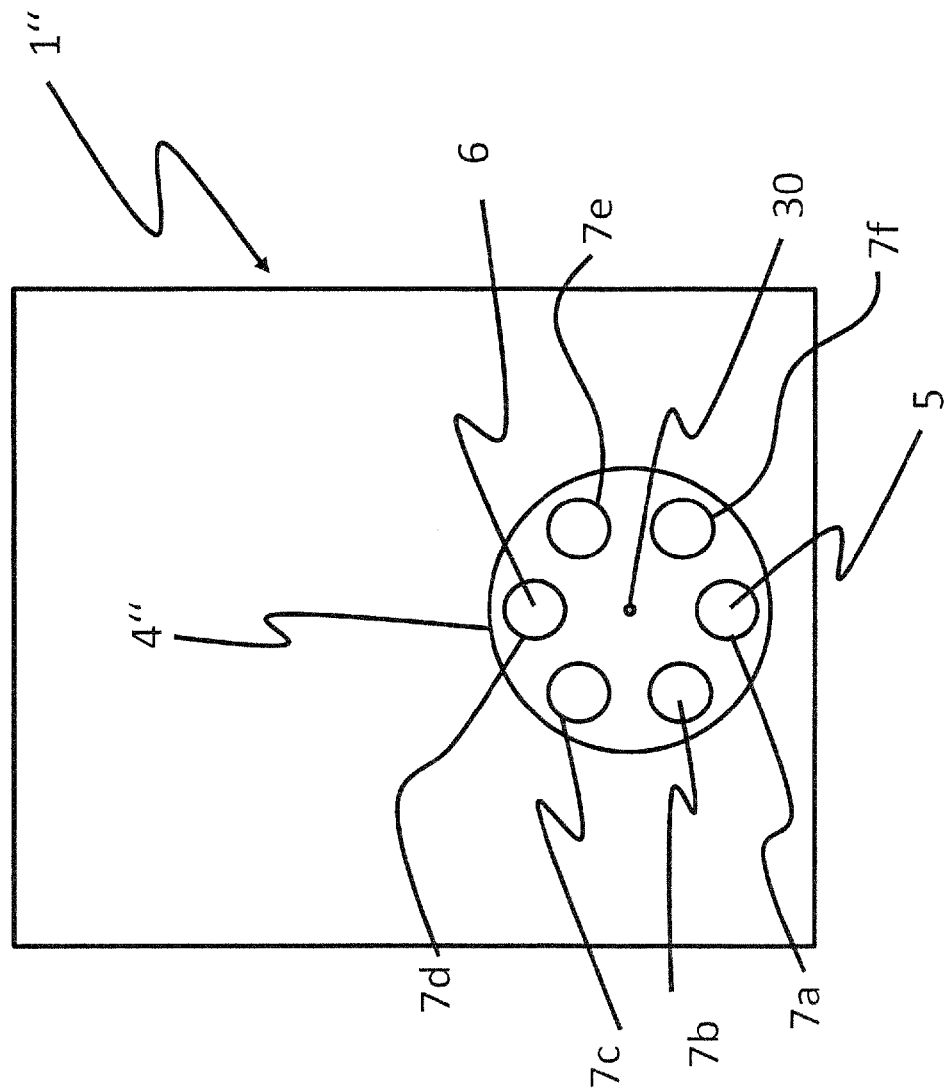
FIG. 3b The embodiment of FIG. 3a in a schematic plan view onto the sample holders of the cone carousel.

FIG. 3b shows the third embodiment represented in FIG. 3a in a schematic plan view onto the six sample holders 7a, 7b, 7c, 7d, 7e, 7f of the cone carousel.

Figure 4A:
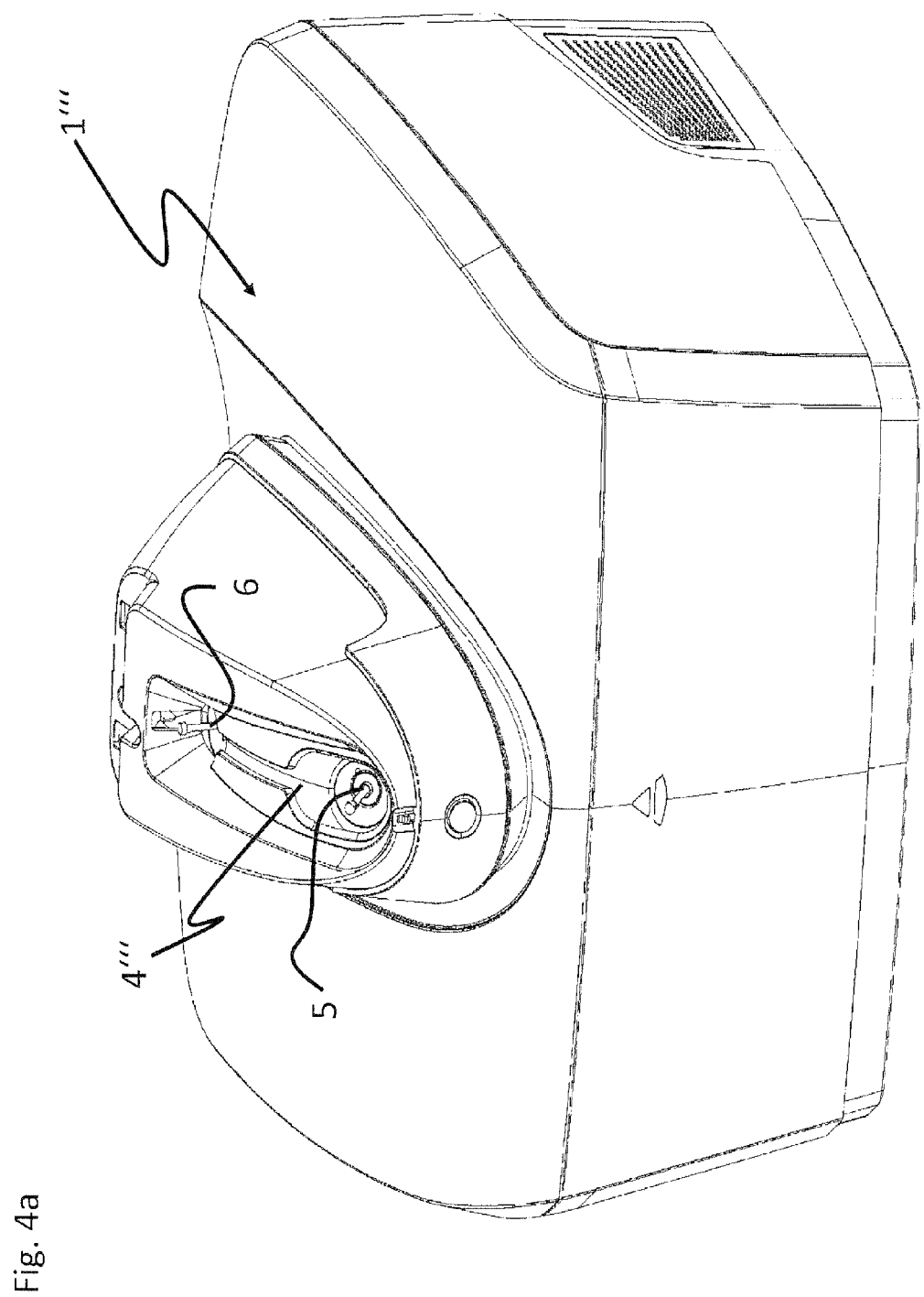
FIG. 4a A three-dimensional representation of a fourth embodiment of the inventive NMR spectrometer similar to the embodiment according to FIGS. 2a-2d, without the cover of the sample changer.

FIG. 4a shows a three-dimensional representation of a fourth embodiment of the inventive NMR spectrometer 1''', which strongly resembles the second embodiment of FIGS. 2a to 2d, with an uncovered sample changer 4''', wherein the loading position 5 of the sample changer 4''' is located in a front region of the NMR spectrometer 1'''. The latter additionally exhibits tapering in the front region, which eases access to loading position 5, even from the side.

Figure 4B:
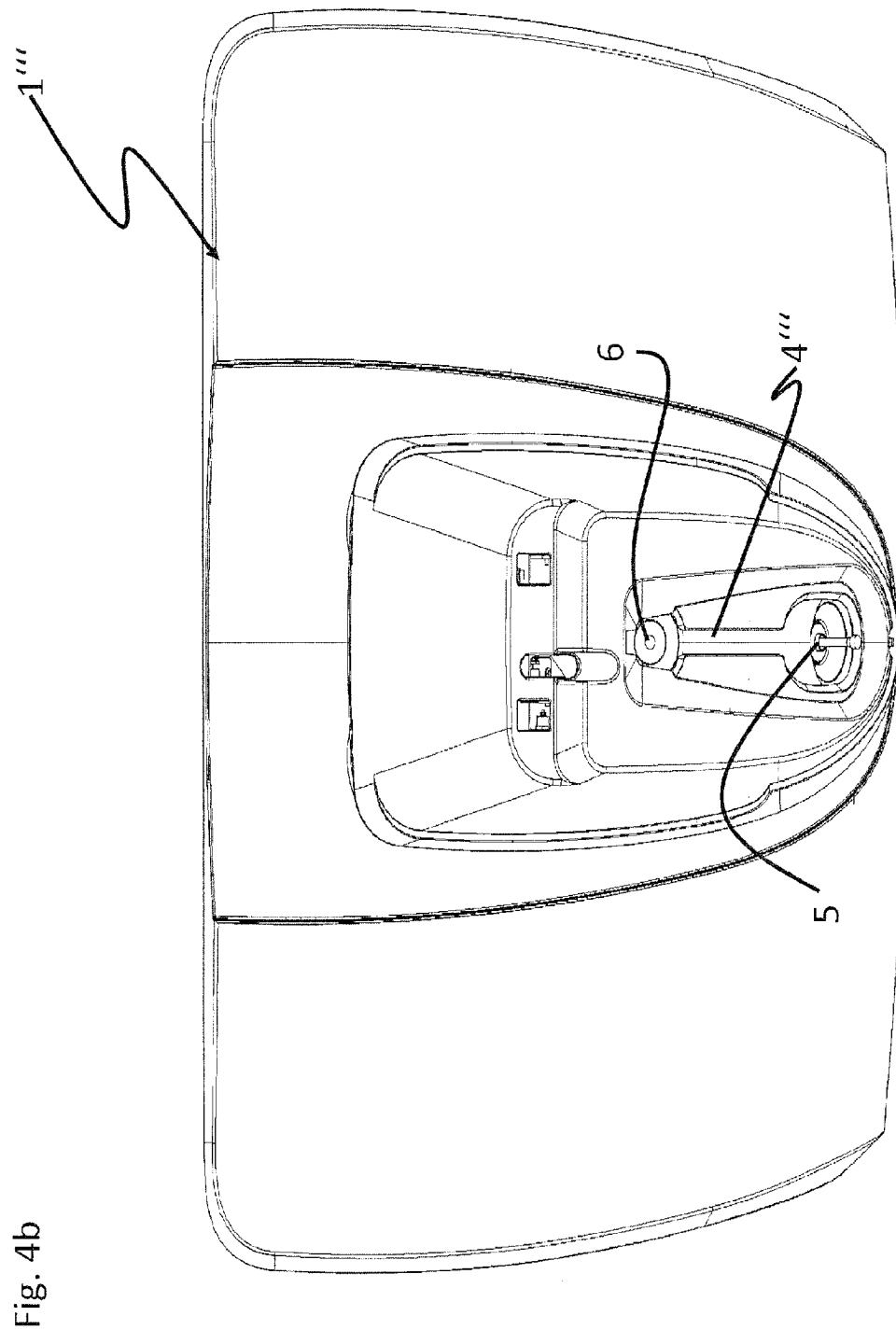

FIG. 4b shows a plan view onto the embodiment according to FIG. 4a.

Figure 4C:
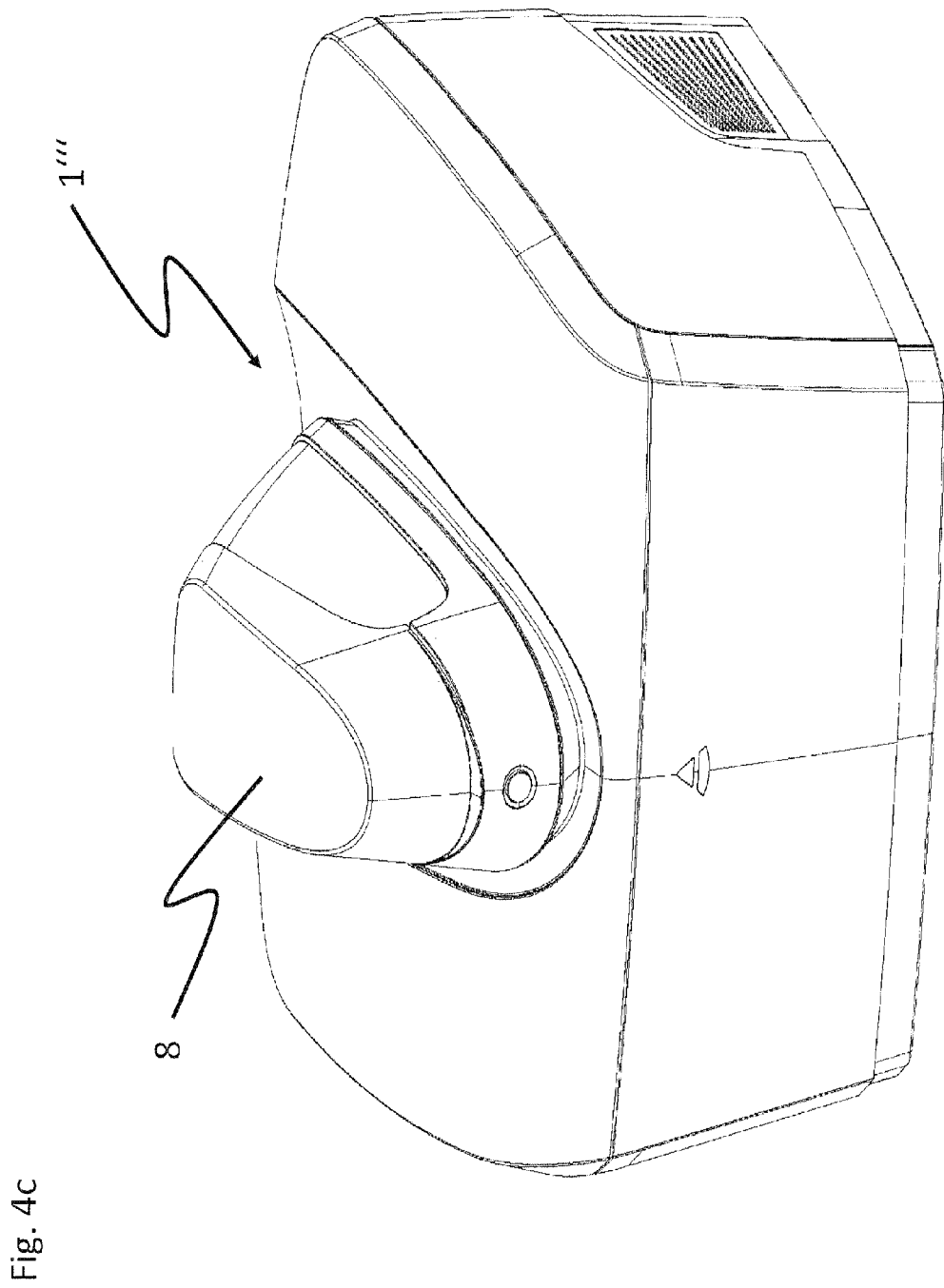
FIG. 4c An embodiment as in FIG. 4a, but with a cover on the sample changer.

FIG. 4c shows the embodiment of FIG. 4a, but with a cover 8 of the sample changer 4''' in the closed condition. This cover 8 can be opened—as shown in FIGS. 4a and 4b—to load the NMR spectrometer 1''' with one or more NMR samples. The sample changer 4''' can comprise a motor—not shown in the drawing—which after inserting an NMR sample at loading position 5 and closing the cover 8, moves the sample changer 4''' in such a way that the NMR sample is brought into the transfer position 6.

Figure 4D:
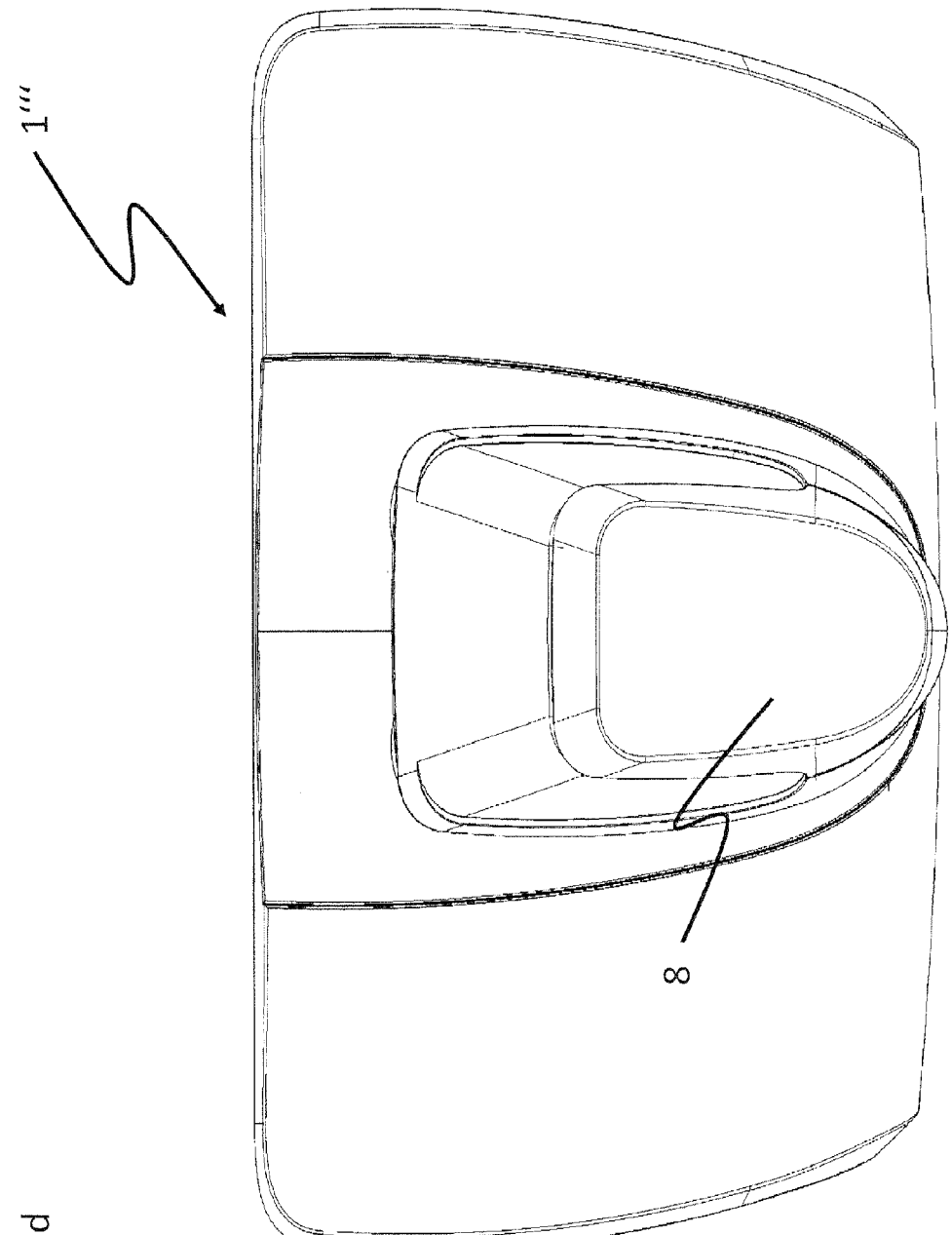
FIG. 4d A plan view onto the embodiment according to FIG. 4c.

FIG. 4d finally shows a plan view onto the embodiment of the inventive NMR spectrometer 1''' illustrated in FIG. 4c.

We claim:

1. An NMR (=nuclear magnetic resonance) spectrometer for measurement of an elongated NMR sample or for measurement of an elongated NMR sample located within a sample vial, the elongated sample extending along a sample axis, the spectrometer comprising:
   a magnet configuration having a substantially vertically aligned, elongated upper opening for receiving the elongated NMR sample, said magnet configuration defining a measurement volume having a measuring position at which the elongated NMR sample is positioned during performance of an NMR measurement;
   a sample changer comprising at least one cylindrical sample holder having a cylinder axis, said sample holder structured for receiving the NMR sample at a loading position and for transferring the NMR sample into the measurement volume at a transfer position, wherein said sample holder is open in an upward direction, said cylinder axis of said cylindrical sample holder being inclined at said loading position by an angle of inclination a of between 30 and 60 degrees with respect to a vertical direction, said cylinder axis extending in the vertical direction at said transfer position; and
   a positioning device which transfers the NMR sample at said transfer position or after having passed through said transfer position into said measuring position in said measurement volume, wherein the elongated NMR sample is positioned with a vertically aligned sample axis in said measuring position.

2. The NMR spectrometer of claim 1, wherein said angle of inclination a of said cylinder axis of said sample holder at said loading position is between 40 and 50 degrees with respect to the vertical direction.

3. The NMR spectrometer of claim 1, wherein said sample holder has a funnel-shaped opening for easier insertion of the NMR sample.

4. The NMR spectrometer of claim 1, wherein said sample holder has an electrically controlled locking device, which releases the NMR sample at said transfer position.

5. The NMR spectrometer of claim 1, wherein NMR spectrometer comprises a device for pneumatically lowering and raising the NMR sample at said transfer position.

6. The NMR spectrometer of claim 1, wherein the NMR spectrometer further comprises a device for pneumatically spinning the NMR sample in a region of said measurement volume.

7. The NMR spectrometer of claim 1, wherein said magnet configuration comprises a horseshoe magnet, a segmented magnet or a ring magnet.

8. The NMR spectrometer of claim 1, wherein said angle of inclination a of said cylinder axis of said sample holder at said loading position is adjustable.

9. The NMR spectrometer of claim 1, wherein said sample changer has a cover, which must be opened to load the NMR spectrometer with one or more NMR samples.

10. The NMR spectrometer of claim 9, wherein said sample changer has a motor, which, after inserting an NMR sample at said loading position and closing said cover, moves said sample changer in such a manner that the NMR sample is brought into said transfer position.

11. The NMR spectrometer of claim 1, wherein said sample changer comprises a rocker, which can be rotated around a horizontal axis of rotation.

12. The NMR spectrometer of claim 1, wherein said sample changer is designed as a cone carousel, which can be rotated around an axis of rotation inclined with respect to the vertical direction.

13. The NMR spectrometer of claim 12, wherein an angle of said axis of rotation with respect to the vertical direction is between 15 and 30 degrees or between 20 and 25 degrees.

14. The NMR spectrometer of claim 1, wherein said sample changer comprises multiple sample holders for storing NMR samples.

15. The NMR spectrometer of claim 14, further comprising an additional sample holder structured to accept a calibration sample for calibrating and self-monitoring of the NMR spectrometer.

* * * * *